United States Patent [19]

Bramwell

[11] Patent Number: 4,599,484
[45] Date of Patent: Jul. 8, 1986

[54] BOX FOR ELECTRICAL COMPONENTS

[75] Inventor: David W. Bramwell, Prestatyn, Wales

[73] Assignee: EGA Limited, United Kingdom

[21] Appl. No.: 628,810

[22] Filed: Jul. 9, 1984

[51] Int. Cl.[4] ............................................. H05K 5/02
[52] U.S. Cl. .................................... 174/52 R; 411/437
[58] Field of Search ................... 174/50, 52 R, 53, 48; 361/356; 411/437, 174, 182, 908

[56]  References Cited

U.S. PATENT DOCUMENTS

| 2,788,047 | 4/1957  | Rapata         | 411/182    |
| 3,129,396 | 4/1964  | Germain et al. | 174/50 X   |
| 3,200,244 | 8/1965  | Meyer          | 174/48 X   |
| 3,780,353 | 12/1973 | Gordon et al.  | 174/52 R X |

FOREIGN PATENT DOCUMENTS

| 459517  | 1/1937  | United Kingdom .          |
| 713389  | 8/1954  | United Kingdom ... 174/59 |
| 1131782 | 10/1968 | United Kingdom .          |
| 1159189 | 7/1969  | United Kingdom ... 174/48 |
| 1366465 | 9/1974  | United Kingdom .          |
| 1590018 | 5/1981  | United Kingdom .          |

Primary Examiner—Arthur T. Grimley
Assistant Examiner—D. A. Tone
Attorney, Agent, or Firm—Andrus, Sceales, Starke & Sawall

[57] ABSTRACT

Boxes for electrical components are provided with elongate grooves (3, 26) to receive self-tapping or thread cutting screws for securing the components in the box. The grooves may extend above or below the bottom of the box.

6 Claims, 5 Drawing Figures

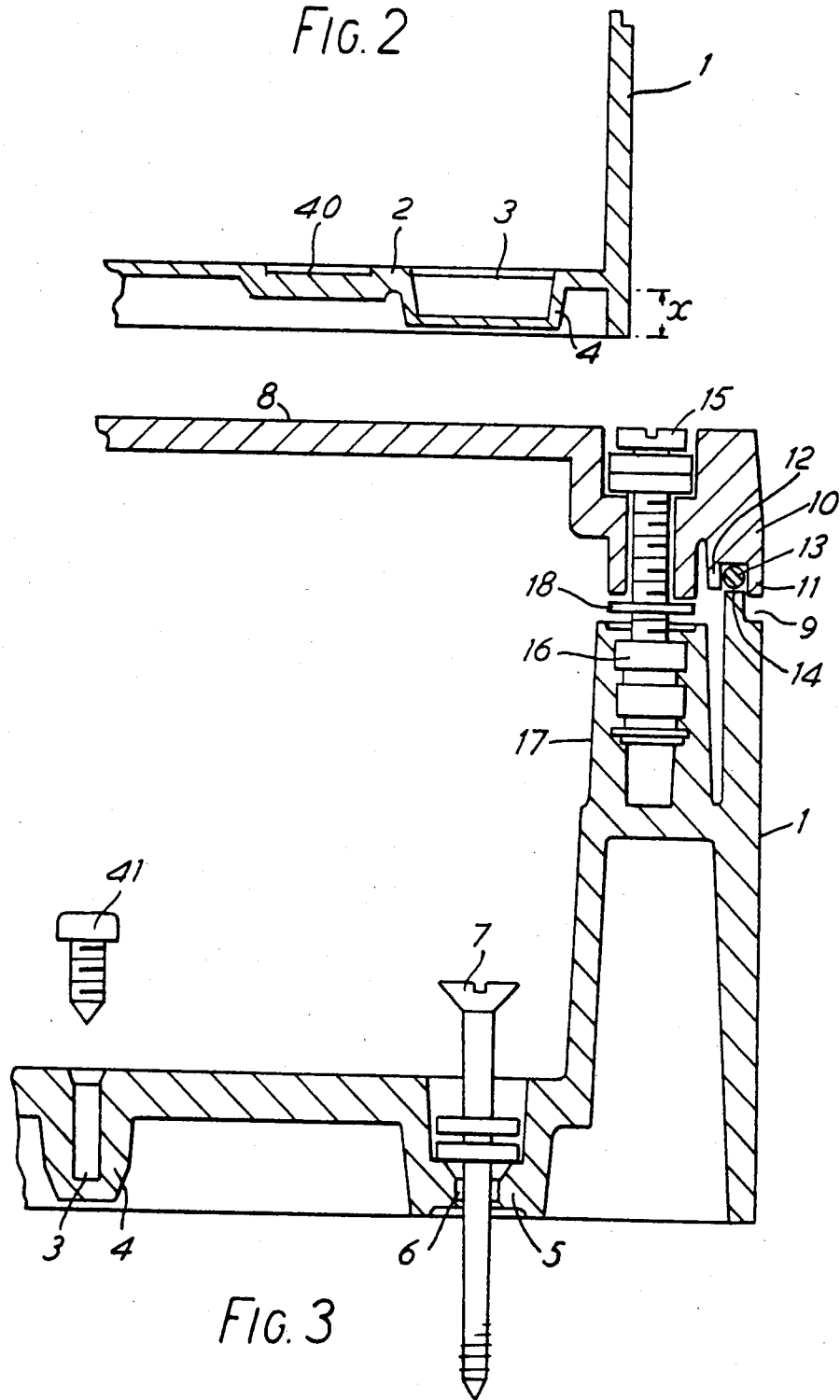

BOX FOR ELECTRICAL COMPONENTS

BACKGROUND OF THE INVENTION

Field of the Invention

This invention relates to boxes intended to contain electrical circuit elements such as terminals, relays and lighting components.

British Patent Specification No. 459,517 (Electric Supplies) dated July 8, 1936, discloses a wall box for electrical switches and the like, in which an adaptor plate having four radially extending slots is secured parallel the base of the box, and the base is provided with corresponding channels under the slots. Anchor elements, such as internally-threaded nipples can be inserted in the slots with their heads accommodated in the channels such that they cannot be pulled out through the slots. The anchor elements can be positioned along the four orthogonal axes defined by the slots to provide fixing anchors for an electrical switch or the like to be secured in the wall box. Such a box requires an additional element, the adaptor plate which takes-up room within the box, has to be provided with some means of securing it in the box and can provide fixing means only over a restricted portion of the entire box surface.

British Patent Specification No. 1,590,018 (Ritherdon) discloses a wall-mounted cabinet on the inner surface of the rear wall of which are provided perforated strip-like mounting members arranged in parallel, spaced relation to the rear wall. Sketched between the mounting members are one or more detachable, perforate mounting members or stringers. The mounting members form a "false back" to which components can be fixed. Again the cabinet requires additional components to provide the fixing means.

SUMMARY OF THE INVENTION

According to an aspect of the invention there is provided a box for electrical components of which an interior surface is provided with at least one elongate groove dimensioned to receive and engage self-tapping screws for securing electrical components within the box. The groove may be such that a screw may be engaged at substantially any point along the groove.

The grooves may be positioned on the bottom of the box and may form a pattern extending over most of the area of the bottom so that screws may be inserted at a wide variety of locations in the box, allowing a high degree of flexibility in locating components therein. The grooves may be formed either by ridges extending above the bottom (i.e. extending into the box interior) or by channel portions extending below the bottom. In the latter case the walls of the box may extend below the bottom and the lower exterior surfaces of the channel portions may be substantially flush with the lower edges of the walls of the box.

The grooves may be dimensioned so as to receive a standard self-tapping or thread cutting screw, such as a No. 6 screw in such a manner that the screw thread will bite the interior walls of the grooves and provide a screw fastening for components engaging the screw. The lower portion of the grooves may be parallel sided so that the lower portion is of uniform width but the upper edges of the grooves may be bevelled, providing an upper portion of increased width capable of receiving a larger screw, for example a No. 8 self-tapping or thread cutting screw. This arrangement allows more than one size of screw to be used.

The box bottom may be provided with holes to receive screws for mounting the box on a wall or other support surface.

One type of box may be closed with a lid attached to the body of the box by screws and a gasket may be provided between the lid and box body to render the box dust-resistant and moisture-resistant in order to protect components mounted inside. Wires may be run into the box through holes in the bottom or walls. The holes may be drilled or formed by pushing out knock-out portions of small thickness provided in the walls or bottom.

Another type of box comprises two half-boxes of similar construction which are held together by screws with their respective upper edges abutting face-to-face: in this embodiment both half-boxes may be provided with grooves so that components can be mounted on either half. Wires can enter the box so formed by holes in the bottoms or walls of the half-boxes. Alternatively the abutting edges may be such that when the half-boxes are assembled together a gap between the edges is provided on part of the periphery of the boxes, the gap being wide enough to allow wires to pass through. The gap may be occupied by a pad of resilient material mounted on at least one of the edges to close the gap and render the box dust-resistant while allowing passage of wires through the gap while clamping the cables to prevent forced withdrawal.

The boxes may be made by molding of polyvinylchloride, a polycarbonate or other plastic material.

BRIEF DESCRIPTION OF THE DRAWINGS

Boxes according to embodiments of the invention will now be described by way of example with reference to the accompanying drawings, in which:

FIG. 2 is a cross-section of a wall and part of the bottom of the box of FIG. 1, one of the slots being shown in longitudinal cross-section, FIG. 3 is another cross-section of a wall and part of the bottom of the box of FIG. 1, one of the slots being shown in transverse cross-section.

DESCRIPTION OF PREFERRED EMBODIMENTS

Figure 1:
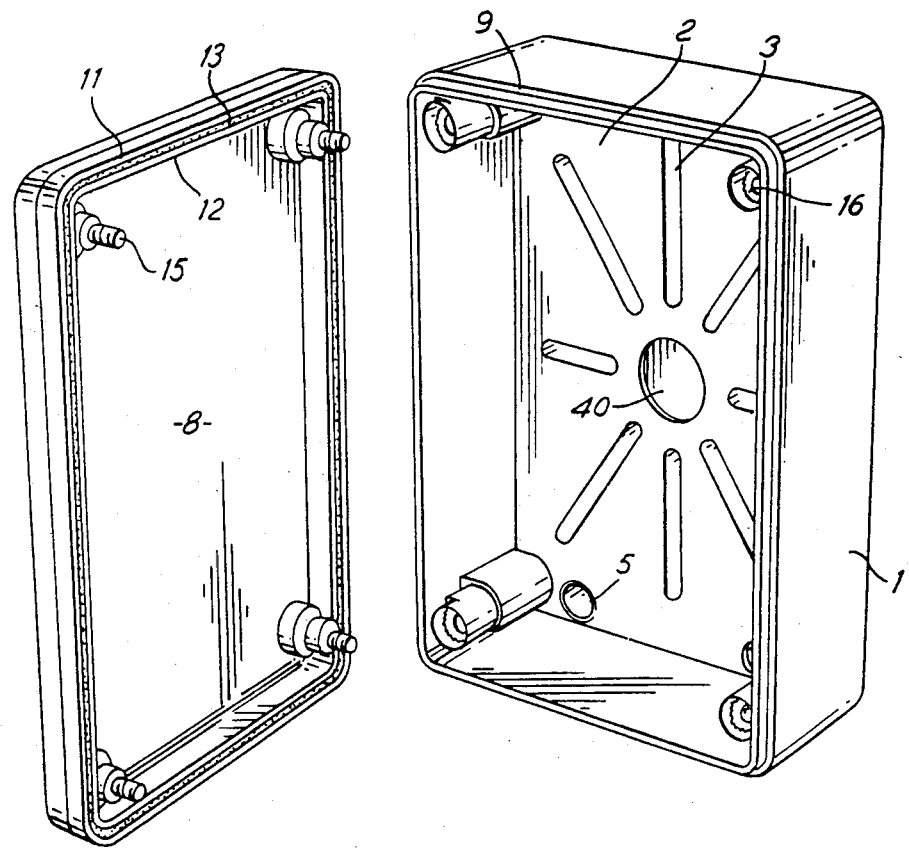
FIG. 1 is a perspective view of a box and lid to contain electrical circuit elements, the bottom of the box being provided with slots.

Referring to FIGS. 1 and 2 an open-topped box has walls 1 of height 54 mm and thickness 3.5 mm and a flat bottom 2 of thickness 3.5 mm, the lower surface of the bottom being raised above the lower edge of the wall by a distance of 8 mm.

The bottom is provided with a plurality of slots 3 defined by channel portions 4 extending below the bottom, the lower surfaces of the channel portions being almost flush with the lower edges of the walls. The slots are of uniform width and are shown in cross-section in FIG. 3. The depth of each slot is 9.5 mm, the lower part of the slot is parallel-sided and of width 2.7 mm whereas the upper part of the slot has edges bevelled to 15° from the vertical. These slot dimensions allow a standard No. 6 self-tapping or thread cutting screw 41 to be screwed into and securely held at any point along the slot.

As shown in FIG. 1 the slots are arranged to extend in directions from the centre to the sides of the bottom in different directions so that they form a pattern extending over most of the area of the bottom. This arrangement allows a component to be secured to the bottom of the box at substantially any position by means of a screw inserted into the most convenient slot.

The bottom of the box is provided with means for securing the box to a wall or the like. These means comprise well portions 5 extending below the lower surface of the bottom, as shown in FIG. 3, the lower surface of the well portions being flush with the bottom edge of the wall. The well portions, 4 in number, each have a hole 6 of 4.5 mm diameter to receive a No. 8 woodscrew 7 or 4 mm bolt by which the box may be attached to a wall. The screw or bolt may be provided with a skid washer and a seal washer in conventional manner.

The box may be closed by a lid 8. In order to render the box dust-resistant after assembly the upper edge of wall 1 is provided with a shoulder 9 extending around the whole periphery of the wall. The lid has a downwardly extending edge flange 10 to engage the upper edge of the wall and the engaging surface of the flange has an outer lip 11 to extend into the shoulder 9, an inner lip 12 of lesser depth than lip 11 and a gasket 13 of resilient material between the lips to abut the edge 14 of the wall.

The lid is held against the wall of the box by threaded bolts 15 which extend through holes in the lid and engage threaded inserts 16 mounted in holes formed in pillars 17 projecting inwardly of the walls adjacent the corners of the box. A gasket seal 18 is provided around each bolt 15 and the bolt is provided with a skid washer and seal washer adjacent the head. Entry of dust to the box past the bolt is thus prevented.

Wiring may be led into the box through holes provided in the sides or bottom. Such holes may be made by drilling or the box wall and/or bottom may comprise knock-out portions which are pressed out as required to provide the necessary openings.

Figure 4:
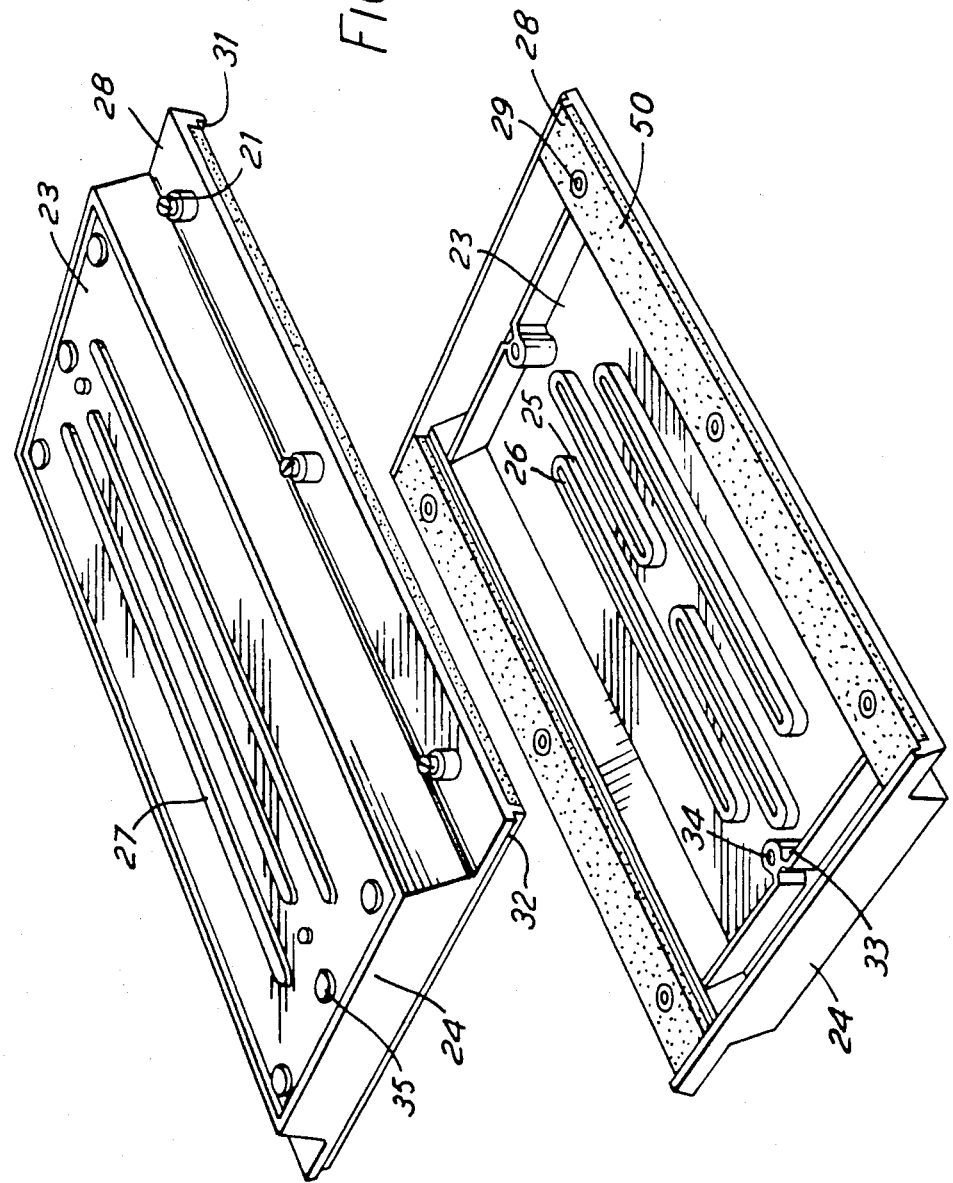
FIGS. 4 and 5 are perspective views of another type of box shown open and closed respectively.
Figure 5:
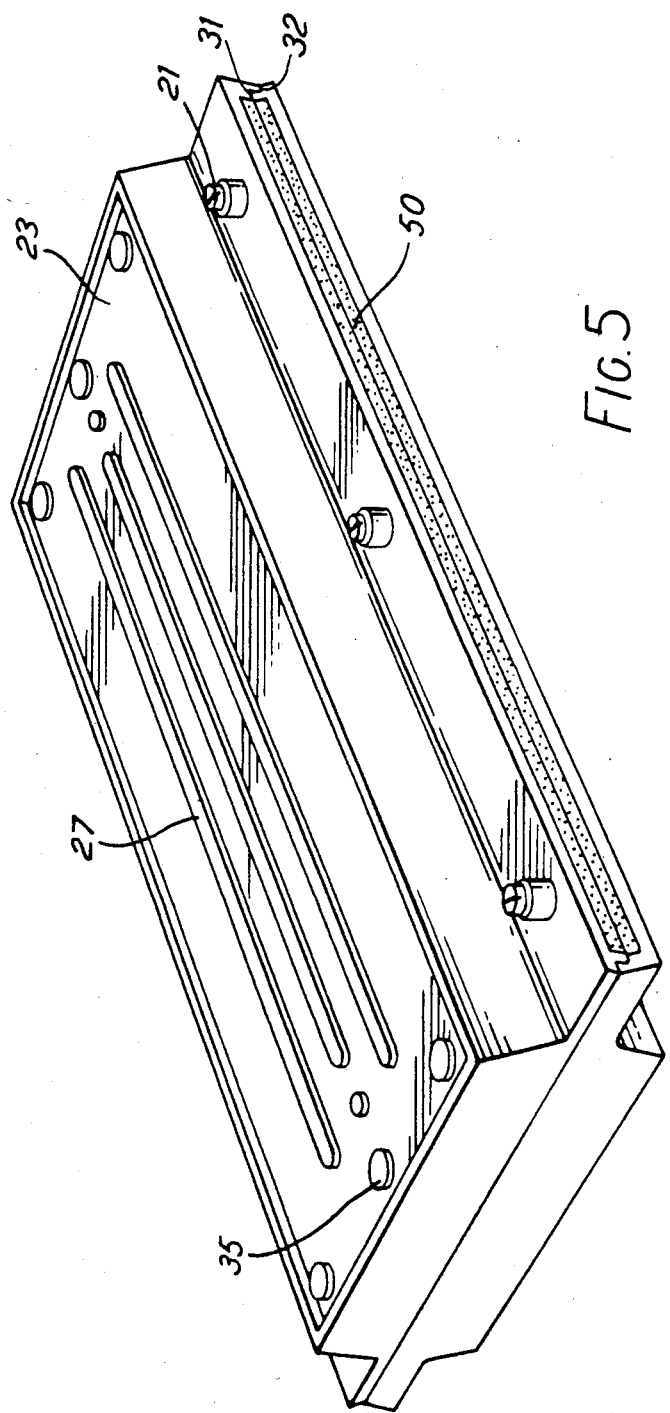

The box shown in FIGS. 4 and 5 comprises two identical half boxes which are joined together edge-to-edge to form a closed box. The bottom 23 of each half-box is 2.5 mm thick and has a lower surface 1.5 mm above the lower edge of the wall 24 of the half-box. The upper (inside) surface of the bottom 23 carries upstanding ridges 25 extending 4.5 mm above the inside surface forming grooves 26. The lower surface of the bottom 23 has ribs 27 opposite the grooves extending beyond the bottom by 1 mm. The grooves have a depth of 7 mm and are parallel-sided at their lower part with a width of 4 mm, the upper ends of the grooves being bevelled. These dimensions allow the grooves to securely engage a No. 6 self-tapping or thread cutting screw which may be inserted in and securely engage the groove sides at any point on the grooves. A component may thus be supported within the box in a wide choice of positions.

The upper edge of the wall has an outwardly extending peripheral flange 28 having holes 29 to receive bolts 21 to clamp the two half-boxes together. Holes 29 of the lower half-box shown in FIG. 4 have female threaded inserts to engage these bolts which are inserted through holes 29 of the upper half-box. On both of the shorter sides of the box the flange has an outer upstanding lip of which one has an internal shoulder 31 and the other an external shoulder 32. When two identical half-boxes are fitted together as shown in FIG. 5 the lip having an internal shoulder of one flange engages the lip having an external shoulder of the other flange so that the lips together provide a dust-resistant seal.

When the half-boxes are clamped together in this way there is a gap about 3 mm wide between respective flanges 28 on the longer sides of the box and to fill this gap each of the flanges on the longer sides is provided with a pad 50 of compressible resilient material such as a foam rubber, the pad being about 1.5 mm thick. The abutting pads of the respective half-boxes provide a seal but as the pad material is deformable wires may pass from the exterior to the interior of the box through the gap occupied by the pads, the abutting pads holding the wires in place. This feature allows wires to be passed into the box at any longitudinal position along either of its longer sides.

The bottom of each half-box is also provided with circular upstanding ridges 33 defining circular holes 34 of similar width to grooves 26 to receive self-tapping screws; however, these holes are of greater depth (15 mm) to receive longer screws as required. The bottom is also provided with knock-out portions 35 allowing screws to be passed through the bottom to mount the half-box on a wall or the like.

Both the boxes described above may be made of a known plastic material such as polyvinylchloride or polycarbonate and may be formed to shape by molding.

The boxes described are capable of containing a wide variety of electrical and electronic components and assemblies which are secured inside the boxes by screws engaging the grooves. The boxes have a neat appearance and are easily mounted in any location. The grooves are adapted to receive a standard No. 6 self-tapping or thread cutting screw but as they are slightly wider at the mouth they can also receive a wider No. 8 screw if required.

I claim:

1. A box for electrical components, comprising:
   (a) a bottom wall and side walls with the interior surface of at least said bottom wall being provided with at least one elongated groove,
   (b) said groove having a lower portion, an upper portion and a pair of spaced upper edges,
   (c) said groove being defined by a channel extending below said bottom wall and said side walls of the box extending below said bottom wall with the lower exterior surface of said channel being substantially flush with the lower edges of said side walls,
   (d) said groove having sufficient depth and being otherwise dimensioned to receive and engage self-tapping or thread cutting screws for securing electrical components within the box,
   (e) said lower portion of said groove having elongated parallel sides,
   (f) said upper portion of said groove being formed by elongated converging surfaces which extend from said upper edges to said lower portion of said groove, and
   (g) the construction being such as to provide means for functionally receiving more than one size of said screws.

2. A box according to claim 1 in which said groove is further defined by a pair of ridges disposed inside the box and extending above said bottom wall of the box.

3. A box according to claim 1 which includes a plurality of said elongated grooves which form a pattern extending over substantially the whole of said bottom wall of the box.

4. The box according to claim 1 which comprises:
(a) two similar half boxes having peripheral upper walls adapted to be fastened together at least partially in abutting relationship,
(b) each half box having a said bottom wall and said side walls as well as a said elongated groove.

5. A box according to claim 4 provided with a gap between portions of said peripheral walls when said half boxes are fastened together to provide means to allow passage of wires therethrough.

6. A box according to claim 5 in which a pad of resilient material is disposed within said gap to render the box dust-resistant while allowing passage of wires through said gap while clamping the wires to prevent forced withdrawal thereof from the box.

* * * * *